(12) United States Patent
Pichler et al.

(10) Patent No.: US 10,966,309 B2
(45) Date of Patent: Mar. 30, 2021

(54) DEVICE FOR GENERATING A NON-THERMAL ATMOSPHERIC PRESSURE PLASMA

(71) Applicant: TDK Electronics AG, Munich (DE)

(72) Inventors: Johann Pichler, Breitenau am Hochlantsch (AT); Michael Weilguni, Hagenberg (AT)

(73) Assignee: TDK ELECTRONICS AG, München (DE)

(*) Notice: Subject to any disclaimer, the term of this patent is extended or adjusted under 35 U.S.C. 154(b) by 33 days.

(21) Appl. No.: 16/494,256

(22) PCT Filed: Mar. 14, 2018

(86) PCT No.: PCT/EP2018/056431
§ 371 (c)(1),
(2) Date: Sep. 13, 2019

(87) PCT Pub. No.: WO2018/167167
PCT Pub. Date: Sep. 20, 2018

(65) Prior Publication Data
US 2020/0137865 A1  Apr. 30, 2020

(30) Foreign Application Priority Data
Mar. 14, 2017 (DE) .................. 102017105401.4

(51) Int. Cl.
*H01L 41/04* (2006.01)
*H05H 1/24* (2006.01)
(Continued)

(52) U.S. Cl.
CPC .......... *H05H 1/2475* (2013.01); *A01M 29/18* (2013.01); *G01N 15/1031* (2013.01);
(Continued)

(58) Field of Classification Search
CPC ..... H01L 41/00; H01L 41/044; H01L 41/053; H01L 41/107; H05H 1/24; H05H 1/2475;
(Continued)

(56) References Cited

U.S. PATENT DOCUMENTS 7,023,142 B2 * 4/2006 Chou ................. H05B 41/2822
315/209 PZ
7,423,503 B2 * 9/2008 Larson, III ............. H03H 9/132
333/189
(Continued)

FOREIGN PATENT DOCUMENTS

CN          101259036 A     9/2008
DE        102013110266 A1   4/2015
(Continued)

OTHER PUBLICATIONS

Itoh, H. et al., "Discharge Plasmas Generated by Piezoelectric Transformers and Their Applications," Institute of Physics Publishing, Plasma Sources Science and Technology, vol. 15, May 1, 2006, 11 pages.
(Continued)

*Primary Examiner* — Haissa Philogene
(74) *Attorney, Agent, or Firm* — Slater Matsil, LLP (57) ABSTRACT

A device for generating a non-thermal atmospheric pressure plasma is disclosed. In an embodiment a device includes a first piezoelectric transformer configured to ignite a non-thermal atmospheric pressure plasma in a process medium and a control circuit configured to apply an input voltage to the first piezoelectric transformer and to perform a modulation of the input voltage such that the first piezoelectric transformer generates an acoustic signal as a result of the modulation.

35 Claims, 8 Drawing Sheets

(51) Int. Cl.
*A01M 29/18* (2011.01)
*G01N 15/10* (2006.01)
*H01L 41/053* (2006.01)
*H01L 41/107* (2006.01)

(52) U.S. Cl.
CPC .......... *H01L 41/044* (2013.01); *H01L 41/053* (2013.01); *H01L 41/107* (2013.01); *H05H 2001/2481* (2013.01)

(58) Field of Classification Search
CPC ....... H05H 2001/2481; H05H 2240/20; H05H 2240/10; H05B 41/2822; H05B 41/2881; H05B 41/3925; H05B 41/3927; A01M 29/18
See application file for complete search history.

(56) References Cited

U.S. PATENT DOCUMENTS

| | | | | |
|---|---|---|---|---|
| 7,525,398 B2* | 4/2009 | Nishimura | ............. | H04B 11/00 310/323.02 |
| 7,948,187 B2* | 5/2011 | Greening | ........... | H05B 41/2822 315/209 PZ |
| 8,896,211 B2* | 11/2014 | Ish-Yamini Tomer | ........................ | A61B 18/042 315/111.21 |
| 9,797,241 B2* | 10/2017 | McRory | ................ | B06B 1/0215 |
| 10,143,510 B2 | 12/2018 | Nettesheim et al. | | |
| 10,164,165 B2 | 12/2018 | Kraxner et al. | | |
| 10,506,699 B2* | 12/2019 | Rinner | .................. | H01L 41/107 |
| 10,567,887 B2 | 2/2020 | Gilligan | | |
| 10,772,182 B2* | 9/2020 | Weilguni | ............. | H05H 1/2475 |
| 2009/0039798 A1 | 2/2009 | Siessegger | | |
| 2016/0129142 A1 | 5/2016 | Nettesheim | | |
| 2016/0287892 A1 | 10/2016 | Nettesheim et al. | | |
| 2017/0208675 A1 | 7/2017 | Doellgast et al. | | |
| 2020/0187343 A1 | 6/2020 | Weilguni et al. | | |

FOREIGN PATENT DOCUMENTS

| | | |
|---|---|---|
| DE | 102014110405 A1 | 1/2016 |
| JP | 2003346669 A | 12/2003 |
| JP | 2009140722 A | 6/2009 |
| JP | 2016171792 A | 9/2016 |
| JP | 2016531654 A | 10/2016 |
| JP | 2017504954 A | 2/2017 |
| JP | 2017508485 A | 3/2017 |
| JP | 2019507943 A | 3/2019 |
| JP | 2019533319 A | 11/2019 |
| WO | 2006108394 A1 | 10/2006 |

OTHER PUBLICATIONS

Lineykin, S. et al., "Feedback Isolation by Piezoelectric Transformers: Comparison of Amplitude to Frequency Modulation," 2004 35th Annual IEEE Power Electronics Specialists Conference, Aachen, Germany, Jun. 20, 2004, 7 pages.

* cited by examiner

DEVICE FOR GENERATING A NON-THERMAL ATMOSPHERIC PRESSURE PLASMA

This patent application is a national phase filing under section 371 of PCT/EP2018/056431, filed Mar. 14, 2018, which claims the priority of German patent application 102017105401.4, filed Mar. 14, 2017, each of which is incorporated herein by reference in its entirety.

TECHNICAL FIELD

The present invention relates to a device for generating a non-thermal atmospheric pressure plasma. In particular, the device has a piezoelectric transformer. The device is also designed to generate an acoustic signal.

SUMMARY OF THE INVENTION

By means of a device that enables both a non-thermal atmospheric pressure plasma and an acoustic signal to be generated, in many applications synergies can be exploited between the plasma and the acoustic signal. For example, both a non-thermal atmospheric pressure plasma and an acoustic signal in the ultrasound frequency range can be used for cleaning and disinfection. If the device is now used to generate both plasma as well as ultrasound, both can be used simultaneously for cleaning and disinfection, resulting in a high efficiency of the cleaning and disinfection processes.

Other applications of the device are also possible, in which only the acoustic signal is required for the intended purpose. For example, in a plasma loudspeaker an acoustic signal can be generated by forming a plasma. Plasma loudspeakers are characterized by a linear frequency response over a wide frequency range. A linear frequency response in the frequency range exists in which for a given input power, the power of a generated acoustic signal does not vary significantly, for example, by less than 5 dB for different frequencies of the range.

Embodiments provide a device that allows both an acoustic signal and a non-thermal atmospheric pressure plasma to be generated.

Embodiments propose a device for generating a non-thermal atmospheric pressure plasma, having a first piezoelectric transformer, which is designed to ignite a non-thermal atmospheric pressure plasma in a process medium, and having a control circuit, which is designed to apply an input voltage to the first piezoelectric transformer, wherein the control circuit is designed to perform a modulation of the input voltage such that the first piezoelectric transformer generates an acoustic signal as a result of the modulation.

Embodiments of the present invention therefore relate to a device, in which by means of a piezoelectric transformer, on the output-side end face of which a plasma can be ignited, both plasma as well as an acoustic signal can be generated. If the input voltage applied to the piezoelectric transformer is modulated, so the high voltage generated in an output area of the piezoelectric transformer also exhibits the modulation. Thus, the power of the high voltage and therefore the amplitude of a non-thermal atmospheric pressure plasma that is generated by the piezoelectric transformer, fluctuate according to the modulation of the input voltage. It is the fluctuation in the amplitude of the generated plasma that generates an acoustic signal. A process medium surrounding the piezoelectric transformer can then oscillate. By changing the volume of a plasma flame produced, pressure differences occur in the process medium, which are perceived as an acoustic signal. The pressure fluctuations as a result of modulation of the generated plasma can therefore lead to a vibration of the process medium, by means of which an acoustic signal is generated.

Because the plasma whose amplitude is modulated to produce the sound is generated by means of a piezoelectric transformer, a wide range of benefits can be achieved.

The size of the device can be designed very small, as no transformer components are required for the transmission of the acoustic signal. Furthermore, the system is free of mechanical inertia, since the sound generation by means of plasma does not require a mechanical diaphragm, but rather vibrations of the process medium can be effected directly. Accordingly, an acoustic signal can be generated in a very wide frequency range. In contrast, in the case of mechanical systems for sound generation an achievable upper cutoff frequency is usually limited by the inertia of the system. If the acoustic signal is generated by means of the piezoelectric transformer, then the upper cutoff frequency is constrained by the geometry of the transformer, so that a very high upper cutoff frequency can be achieved. In addition, in a piezoelectric transformer the upper cutoff frequency is also defined by the material of the transformer and its piezoelectric and mechanical quality.

If a PZT ceramic is used as a piezoelectric material for the piezoelectric transformer, then the upper cutoff frequency for a component length of 30 mm is around 130 kHz. For a piezoelectric transformer for which the piezoelectric material is a lead-free ceramic, the upper cutoff frequency for a piezoelectric transformer with a length of 50 mm can also be approximately 130 kHz.

By reducing the length of the transformer the upper cutoff frequency could be further increased.

Compared to systems in which coil transformers are used for generating plasma and sound, the device in which the plasma is generated by means of a piezoelectric transformer also has substantial benefits. Since no high voltage transformers are required in the device according to embodiments of the invention, the device can be manufactured with a small component size. It can therefore easily be integrated into a loudspeaker or a loudspeaker system. In addition, the energy consumption of a piezoelectric transformer is low. Accordingly, the device can be operated using a battery. This results in safety advantages over systems where a mains voltage is needed to generate high power levels.

In the device it may be sufficient to shield the piezoelectric transformer from dominant electromagnetic waves. However, it is possible to omit shielding other elements of the device. This also enables a small assembly size of the device.

The small device size and the low voltage and power requirements of the device as well as an insensitivity of the piezoelectric transformer to damage mean that the device has a wide range of potential applications. One conceivable application, for example, is the use of the device in dental medicine. In this case, teeth and/or gums could be cleaned and disinfected by means of plasma and an acoustic signal in the ultrasonic frequency range. Systems in which a mains voltage is required for the plasma generation cannot be used for this application, or only by observing special precautions and the associated cost overhead, since the use of mains voltage resulting in safety risks. In addition, due to an excessive component size, systems in which a mains voltage is required for the plasma generation are often inappropriate for application in dental medicine.

The term process medium can be used to the medium in which the plasma is ignited. The process medium can be, for example, an ambient air of the piezoelectric transformer. The process medium can also be any substance existing in a gaseous form at the working temperature and the working pressure, all conceivable mixture substances that exist in gaseous form at the working temperature and working pressure, an aerosol, which has liquid and/or solid particles suspended in a gas, a liquid or biological tissue. The working pressure and the working temperature specify the pressure and/or the temperature at which the device for generating the non-thermal atmospheric pressure plasma is normally used. The working pressure can be, in particular, an atmospheric pressure. The working pressure can be between 0.2 bar and 1.5 bar, preferably between 0.8 bar and 1.2 bar. The working temperature can be, in particular, a room temperature. The working temperature can be in a range between −50° C. and +155° C., preferably between 0° C. and 45° C.

If the process medium is a substance existing in gaseous form, this can be, for example, a pure gas, such as pure He, pure Ar, pure $N_2$, pure $O_2$, pure $CO_2$, pure $H_2$ or pure $Cl_2$. Also, the process medium can be $H_2O$ in the supercritical range. The process medium can contain pure substances which are supercritical, i.e., non-condensable at the working temperature and working pressure.

The process medium can comprise either one or a mixture of a plurality of the above pure gases or of the following gases: air, inert gas and forming gas. The process medium is then chosen such that at the working temperature and working pressure the gas remains in the same state.

The process medium can comprise a liquid aerosol in a gas or in a gas mixture. This can be, for example, air above the dew point, saturated steam or a petrol/diesel-air mixture. The process medium can comprise a solid aerosol in a gas or in a gas mixture. This can be, for example, soot in exhaust gas or fine particulates in air. For medical and technical applications, the use of aerosols as the process medium can achieve particularly good results. The aerosol can be, for example, water droplets in air. It can also be droplets of $H_2O_2$ or formaldehyde. By treating the water droplets with plasma, OH radicals can be generated. In addition, water droplets can be used to bind the resulting irritant gases, for example, ozone or nitrogen oxide, and thus to reduce the environmental impact with these gases in order to increase the application safety. This irritant gas binding can also give rise to an increased effect due to irritant gas, in particular for sterilization, for example, by ozone dissolved in water droplets. The device could also be used in exhaust gas streams for particle removal. The device could also be applied in steam circuits or washrooms and their ventilation circuits, wherein aerosols can also form the process medium.

The device can be arranged in a generating unit for generating plasma and sound. The generating unit may be, for example, a loudspeaker, a medical device, a device for pest control or a pipe system. The generating unit can have an outer housing, in which the device is arranged. The device can also be used stand-alone, however, i.e., without a generating unit with an outer housing.

If sound is generated by the modulation in the plasma generation of the piezoelectric transformer, the following fault mechanisms can occur, which can lead to noise: the piezoelectric transformer is excited into vibration. These vibrations can be transmitted to a mounting of the transformer and/or a housing in which the transformer is arranged, which may cause an acoustic signal to be generated, the frequency of which substantially corresponds to the excitation frequency with which the piezoelectric transformer is operated. To prevent any noise from occurring in the audible range, the excitation frequency of the transformer is preferably chosen sufficiently large. For example, the excitation frequency can be greater than 100 kHz, preferably greater than 130 kHz. In these cases, the vibrations induced by the oscillations of the piezoelectric transformer do not give rise to audible acoustic signals.

The plasma that is generated can also exhibit noise. This noise can be induced by a periodic absence of the plasma ignitions. This interference mechanism as well as ways to reduce the noise in the plasma will be described in more detail later.

The modulation can be an amplitude modulation. The control circuit can be designed to apply an alternating voltage with a carrier frequency to the piezoelectric transformer as the input voltage and to modulate the amplitude of the applied input voltage with a modulation frequency, the modulation frequency being lower than the carrier frequency.

For example, the modulation frequency can be at least a factor of 10 lower than the carrier frequency. The modulation frequency is equal to the desired sound frequency of the acoustic signal to be generated. The carrier frequency can be defined by the geometry and the material of the piezoelectric transformer. The component length, i.e., the distance from an input-side end face to an output-side end face of the piezoelectric transformer, determines its resonance frequency. The carrier frequency should be in direct proximity to the resonance frequency, which means that the carrier frequency should only deviate from the resonance frequency by a few Hertz, for example, not more than 50 Hz.

The acoustic signal can have frequencies in an audible frequency range and/or in an ultrasonic frequency range. The acoustic signal can have, for example, frequencies in a range between 0 Hz and $10^2$ kHz. Frequencies between 16 Hz and 20 kHz are taken here to be the audible frequency range. The ultrasonic frequency range can include frequencies from 20 kHz to 1.6 GHz. Frequencies from the ultrasonic frequency range are not audible to humans, since they are too high in frequency.

The device can have a housing in which the piezoelectric transformer is arranged. The housing can be a resonant volume. The housing can be designed to destroy ozone produced during a plasma ignition. Alternatively or in addition, the housing can also be designed to destroy other resulting exciter gases produced in the plasma generation.

The housing can have, for example, a catalytically active wire mesh. The wire mesh can enclose the transformer. Alternatively, the housing can be designed trumpet-shaped and consist, for example, of copper or another metal. The housing can be a Faraday cage. The housing can be coated with $MnO_2$ (pyrolusite). The above-mentioned embodiments of the housing each make it possible for the ozone and other irritant gases produced in the plasma generation to be destroyed by the housing. Accordingly, a contamination by potentially harmful ozone can be prevented. In many applications, for example, for the use of the device in a loudspeaker, the plasma only represents a by-product of the desired sound generation. For these applications, the housing offers an effective way to avoid the ozone contamination.

The design of the housing as a wire mesh or in the shape of a trumpet can allow the generated ozone to be destroyed in a way that does not affect or damp an acoustic signal generated by the transformer. The acoustic signal can emerge unhindered through openings in the wire mesh or the trumpet shape.

The transformer can be a Rosen transformer. The transformer can have, in particular, an input area to which an input voltage can be applied, and an output area, wherein on an output-side end face of the output area, facing away from the input area, a high voltage is generated when an input voltage is applied to the input area. The input voltage is a low voltage and can originate, for example, from a battery. By means of the high voltage generated at the output-side end face, a plasma can be produced.

The transformer can have an output area on which a high voltage can be generated, which is sufficient to ignite the non-thermal atmospheric pressure plasma without a separate counter-electrode in the process medium. The output voltage generated can be so large as to be sufficient to ionize atoms and molecules of the process medium.

Alternatively, the device also has a counter-electrode, the device being designed to ignite the plasma by means of a voltage generated between an output area of the first piezoelectric transformer and the counter-electrode.

The omission of a counter electrode can enable a more miniaturized design of the device. The use of the counter-electrode can allow a generated plasma jet to be formed in a desired manner. Also, by igniting the plasma against a counter-electrode an audible noise, which can be caused by the plasma jet, can be very strongly to totally suppressed, which provides a significant quality improvement, in particular for the use of the device as a tweeter in the audio field.

The device can be designed and suitable for facilitating, accelerating or catalyzing chemical reactions. The device may, in particular, be provided for destroying or breaking down pollutants, such as nitrogen oxides, carbon monoxide and/or fine particulates.

The device can be designed and suitable for activating or sterilizing surfaces.

The above-mentioned noise of the plasma can be generated by the following mechanism: not every zero-crossing or every half-wave of the input voltage applied to the transformer actually results in a plasma ignition. If a counter-electrode is omitted, approximately every third to every fourth zero-crossing results in a dropout, i.e., to an absence of a plasma ignition. Consequently, the plasma ignitions at the frequency of the activation signal are superimposed by the dropouts, which occur at a frequency equal to, for example, a quarter of the activation frequency. For example, if the activation frequency is 50 kHz, the dropouts can occur at a frequency of about 15 kHz. As a result, the dropouts can occur at a frequency in the audible range. Due to the failure of plasma ignitions, an acoustically perceptible noise can therefore be generated. If the plasma is then ignited against a counter-electrode, the failure of the plasma ignitions occurs less often. Thus the frequency of the noise can be shifted into the ultrasonic range. This is particularly important when the device is used in a plasma loudspeaker.

Alternatively or in addition, the noise of the plasma can also be shifted into the ultrasonic range by driving the piezoelectric transformer with a much higher activation frequency. Assuming a constant frequency of the failure of a plasma ignition, in this case the frequency of the noise would also move into the ultrasonic range. To avoid noise from the plasma in the audible frequency spectrum, the excitation frequency can be greater than 100 kHz, for example, preferably greater than 130 kHz. In these cases, the periodic dropout of the plasma ignitions will only lead to a noise whose frequency is outside the audible range.

In addition, the process medium can be an exhaust gas. In particular, the exhaust gas can be the exhaust gas of an internal combustion engine.

In a further exemplary embodiment a dielectric barrier can be arranged directly adjacent to an output-side end face of the first piezoelectric transformer, the device being designed to capacitively couple a high voltage generated at the output-side end face into an ignition chamber in which the process medium is located, so that a non-thermal atmospheric pressure plasma is ignited in the process medium in the ignition chamber. Accordingly, in this exemplary embodiment the plasma is not ignited directly on the output-side end face of the transformer, but in the ignition chamber, which is spatially separated from the end face by the dielectric barrier.

The dielectric barrier can be, for example, a layer of glass, $SiO_2$ or $Al_2O_3$.

The dielectric barrier can be formed by a coating of the transformer. The coating can either completely cover the piezoelectric transformer, wherein the outer electrodes remain free of the coating, or the coating can only cover the output area of the piezoelectric transformer.

Alternatively, the transformer can be arranged in a cavity that encloses the output area of the piezoelectric transformer. The cavity can have side walls, which form the dielectric barrier. The side walls consist of a dielectric. The transformer can be inserted into the cavity. The cavity can be formed by a fixture, designed to be attached to the device.

The ignition of the plasma in an ignition chamber spatially separated from the piezoelectric transformer can be advantageous for certain applications. If the process medium is not a gaseous medium, but a liquid or biological tissue, the plasma is preferably ignited in the ignition chamber spatially separated from the piezoelectric transformer, in order to prevent the transformer and the process medium coming into direct contact with each other. A liquid might otherwise damage the transformer. Biological tissue, in turn, could be destroyed by direct contact with the piezoelectric transformer. If the device for generating a non-thermal atmospheric pressure plasma is used, for example, in a medical device, such as an endoscope, a dielectric barrier is preferably arranged on the output-side end face of the first piezoelectric transformer to prevent biological tissue and the transformer coming into direct contact with each other. This allows the safety to be increased in the operation of the medical device.

If tissue or a liquid is used as a process medium, the process medium could dampen the vibration of the transformer. The separation of the transformer and the process medium by the dielectric barrier can be used to ensure, however, that the process medium does not dampen the vibration of the transformer.

Even in applications where the plasma must be ignited under high pressure or at high temperatures, it is advantageous to ignite the plasma in an ignition chamber which is physically separate from the transformer. It is then possible to avoid the transformer being exposed to the high pressure and/or high temperature. Otherwise, the high pressure and/or high temperature could damage the transformer and reduce its service life.

If the device for igniting a plasma is used in an aggressive medium or under high temperatures or high pressure, the device is preferably designed in such a way that only the part of the piezoelectric transformer enclosed by the dielectric barrier comes in contact with the process medium. In this case, the dielectric barrier is preferably an inert dielectric, for example, glass. The rest of the device can be isolated from the process medium.

Alternatively, a high voltage generated by the piezoelectric transformer can be coupled into an ignition chamber via an appropriately designed target apparatus.

For example, the target apparatus can comprise a piece of tube made of glass, towards which the piezoelectric transformer can be moved. The target apparatus can be designed to be mechanically coupled with the ignition chamber. For example, the target apparatus can be connected to another piece of tube which is, for example, part of an air-conditioning unit or part of a steam generator, the plasma being thus coupled into the air-conditioning unit or steam generator. Accordingly, using the target apparatus a generated plasma can be directed to the desired location.

It is also advantageous in applications in which the process medium is conductive, to separate the transformer from the process medium by a dielectric barrier.

This can involve, for example, construction metals of air-conditioning units or tools, in which the device is installed.

Furthermore, the dielectric barrier can also be advantageous in applications in which the plasma is used for generating, accelerating or catalyzing chemical reactions. For such applications, however, it may also be advantageous to bring the transformer without a dielectric barrier into contact with the process medium and to ignite a plasma directly in the latter.

The device can also have a second piezoelectric transformer, wherein the control circuit can be designed to apply an input voltage to the second piezoelectric transformer in such a way that the non-thermal atmospheric pressure plasma is generated by a voltage between the two piezoelectric transformers, the first and the second piezoelectric transformers being driven 180° out of phase with each other. Accordingly, the plasma can be ignited in particular between the two transformers. The input voltage applied to the two transformers is amplitude modulated.

Also by the ignition of the plasma between the two transformers, noise can be suppressed in a similar way as in the plasma ignition between a transformer and a counter-electrode. If the plasma is ignited between two transformers operated in anti-phase, then a dropout of the plasma ignition occurs with an even lower frequency and/or regularity than the ignition against a counter-electrode. Accordingly, the frequency of the noise shifts even further into the ultrasonic range, so that the noise is not audible. As a result of the noise reduction the quality of the generated acoustic signal can be significantly improved.

The two transformers, between which the plasma is ignited, can be identical to each other. Alternatively, the transformers can differ in their length and/or in their material composition.

The device can also have at least one additional piezoelectric transformer, which has a length that is different from the length and/or the material composition of the first piezoelectric transformer. The control circuit can also be designed in such a way as to perform a modulation of the input voltage applied to the additional transformer, such that the other piezoelectric transformer also generates an acoustic signal as a result of the modulation.

The transformers can be driven at different frequencies. The transformers can be operated parallel to each other. A parallel operation here refers to an operation in which the transformers are arranged next to each other and the plasma between the transformers is not ignited. By the use of a plurality of transformers that differ from each other in their length and thus their resonance frequency, the acoustic quality of a generated acoustic signal can be improved.

The device can be a hand-held device. A hand-held device may be, in particular, a portable device, which is suitable for mobile deployment at different locations.

Embodiments of the present invention also relate to a loudspeaker having an above-described device. In this case, in particular the linear frequency response over a very wide frequency range of the acoustic sound signal generated by the device leads to a high quality of the loudspeaker. Such a plasma loudspeaker very closely approximates theoretically to an ideal high-tone sonic converter, since it uses the process medium as a diaphragm, which makes it possible to work in an almost mass-free way and also does not allow partial oscillations to occur, which would otherwise lead to tonal discolorations of normal diaphragm materials.

Embodiments of the present invention also relate to an exhaust pipe having an above-described device. The device may, in particular, be used for destroying or breaking down pollutants, such as nitrogen oxides, carbon monoxide and/or fine particulates. Alternatively, the device can be used, for example, for analysis purposes.

Embodiments of the present invention also relate to a medical device having the above-described device. In the device, for example, both the acoustic signal, in particular in the ultrasonic frequency range, as well as the plasma can be used for disinfection and cleaning. This allows synergies to be achieved by cleaning by means of two different signals through. In medical devices, the radicals contained in or generated by the non-thermal atmospheric pressure plasma, as well as other reactive species produced, in particular $O_3$ and $NO_x$, play a particularly important role in the respective applications, such as dental caries treatment, the treatment of wounds or disinfection of surfaces. By the additional combination with the generated acoustic signals the plasma can then be used to increase cleaning and disinfection effects. The medical devices can be, for example, probes and endoscopes.

Embodiments of the present invention also relate to a device for pest control comprising the above-described device. For example, rats, mice, weasels, but also dogs or children can be repelled by means of ultrasound. The plasma can also lead to a synergistic effect in the repulsion of pests. Devices for driving away pests can be used, for example, in cars, gardens, warehouses or pipe systems, such as air-conditioning systems.

Further embodiments of the invention relate to an analysis unit for particle analysis, having a device which is arranged and designed for ionizing particles for analysis purposes and/or for cleaning the exhaust gas stream and/or breaking down the relevant particles.

Yet further embodiments of the invention relate to a pipe system having one of the devices described above or a loudspeaker which has such a device, or an exhaust pipe which has such a device, or a medical device which has such a device, or a piece of equipment for pest control which has such a device, or an analysis unit for particle analysis having such a device.

BRIEF DESCRIPTION OF THE DRAWINGS

In the following the present invention will be described in more detail by reference to the drawings.

DETAILED DESCRIPTION OF ILLUSTRATIVE EMBODIMENTS

Figure 1:
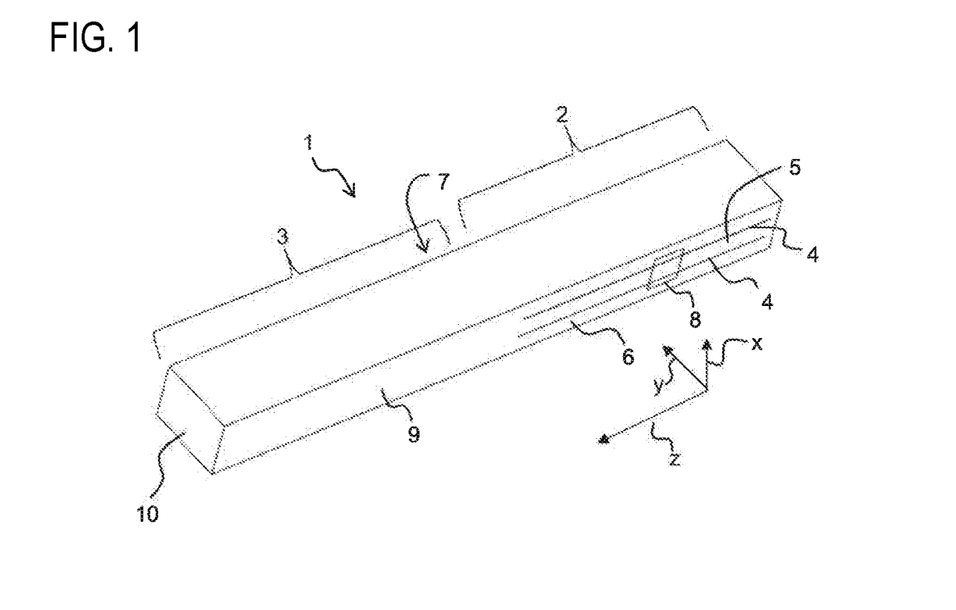
FIG. 1 shows a piezoelectric transformer in a perspective view.

FIG. 1 shows a piezoelectric transformer 1 in a perspective view. The piezoelectric transformer 1 may be deployed, in particular, in a plasma generator for generating non-thermal atmospheric pressure plasma.

A piezoelectric transformer 1 is one design of a resonance transformer based on piezoelectricity, and in contrast to the conventional magnetic transformers, represents an electromechanical system. The piezoelectric transformer 1 is, for example, a transformer of the Rosen type.

The piezoelectric transformer 1 has an input area 2 and an output area 3, wherein the output area 3 is joined to the input area 2 in a longitudinal direction z. In the input area 2, the piezoelectric transformer 1 has electrodes 4 to which an alternating voltage can be applied. The electrodes 4 extend in the longitudinal direction z of the piezoelectric transformer 1. The electrodes 4 are stacked alternately with a piezoelectric material 5 in a stacking direction x, which is perpendicular to the longitudinal direction z. The piezoelectric material 5 is polarized in the stacking direction x.

The electrodes 4 are arranged in the interior of the piezoelectric transformer 1 and are also referred to as internal electrodes. The piezoelectric transformer 1 has a first side surface 6 and a second side surface 7, which is opposite to the first side surface 6. On the first side surface 6, a first external electrode 8 is arranged. On the second side surface 7 a second external electrode is arranged (not shown). The internal electrodes 4 are electrically contacted in the stacking direction x alternately either to the first external electrode 8 or the second external electrode.

The input area 2 can be driven with a low alternating voltage which is applied between the electrodes 4. Due to the piezoelectric effect the alternating voltage applied on the input side is first transformed into a mechanical vibration. The frequency of the mechanical vibration is substantially dependent on the geometry and the mechanical design of the piezoelectric transformer 1.

The output area 3 comprises piezoelectric material 9 and is free of internal electrodes. The piezoelectric material 9 in the output area 3 is polarized in the longitudinal direction x. The piezoelectric material 9 of the output area 3 can be the same material as in the piezoelectric material 5 of the input area 2, wherein the piezoelectric materials 5 and 9 can differ in their polarization direction. In the output area 3 the piezoelectric material 9 is shaped into a single monolithic layer, which is fully polarized in the longitudinal direction z. In this case, the piezoelectric material 9 in the output area 3 only has a single polarization direction.

If an alternating voltage is applied to the electrodes 4 in the input area 2, a mechanical wave is formed within the piezoelectric material 5, 9, which due to the piezoelectric effect generates an output voltage in the output area 3. The output area 3 comprises an output-side end face 10. In the output area 3 an electrical voltage is thus generated between the end face 10 and the end of the electrodes 4 of the input area 2. On the output-side end face 10, a high voltage is also generated. This also produces a high potential difference between the output-side end face and an environment of a piezoelectric transformer, which is sufficient to generate a strong electrical field which ionizes a process medium.

In this way, the piezoelectric transformer 1 generates high electrical fields, which are able to ionize gases or liquids by electrical excitation. In this process atoms or molecules of the respective gas or liquid are ionized and form a plasma. An ionization will always occur if the electric field strength at the surface of the piezoelectric transformer 1 exceeds the ignition field strength of the plasma. The ignition field strength of a plasma refers to the field strength which is necessary for ionization of the atoms or molecules.

Figure 2:
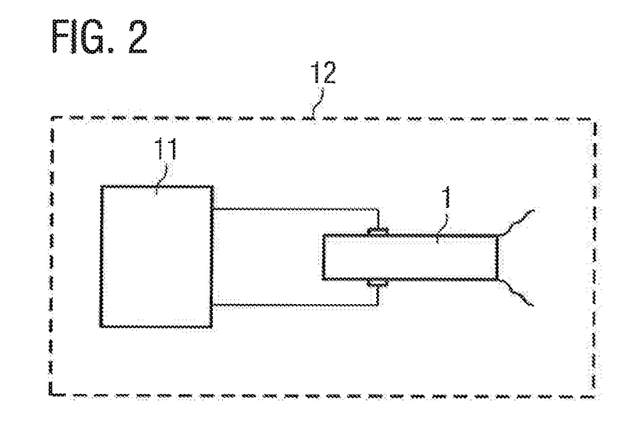
FIG. 2 shows a device for generating a plasma and an acoustic signal in a schematic representation according to a first exemplary embodiment.

In addition to generating a non-thermal atmospheric pressure plasma the piezoelectric transformer shown in FIG. 1 can be used at the same time to generate an acoustic signal. FIG. 2 shows a device for generating a plasma and an acoustic signal. In addition to the piezoelectric transformer 1 the device also has a control circuit 11, designed to apply an input voltage to the transformer 1. The input voltage is the alternating voltage described above, which is applied to the electrodes 4 of the input area 2. The frequency of the input voltage is also referred to in the following as the carrier frequency. The frequency of the input voltage is equal to or at least close to the resonance frequency of the piezoelectric transformer 1, in order to drive it at the first harmonic overtone.

The control circuit 11 is now designed to perform an amplitude modulation of the power applied to the piezoelectric transformer 1. In this case, an amplitude of the input voltage applied to the piezoelectric transformer 1 is modulated with a modulation frequency. The modulation frequency is lower than the carrier frequency. In accordance with the modulation of the amplitude of the input voltage the high voltage generated at the output area 3 of the piezoelectric transformer 1 is also modulated. The power of a plasma generated with the piezoelectric transformer 1 varies with the modulation frequency. Due to the fluctuation in the power of the generated plasma an acoustic signal is generated, the frequency of which matches the modulation frequency.

The generated acoustic signal has a linear frequency response in a frequency range from 0 Hz to $10^2$ kHz. A linear frequency response refers to a characteristic in which the amplitude of the generated acoustic signal is independent of the frequency of the signal in the specified frequency range, or at least deviates by less than 5 dB within the specified frequency range, assuming a constant input power.

The device also comprises a housing 12. The housing 12 surrounds the piezoelectric transformer 1. In the exemplary embodiment shown in FIG. 2 the control circuit 11 is also arranged in the housing 12. Alternatively, the control circuit 11 can be arranged outside the housing 12.

The housing 12 can be a catalytically active wire mesh. The housing 12 is designed in such a way that an acoustic signal generated by the transformer 1 can emerge from the housing 12. The housing 12 is designed to absorb a plasma generated by the piezoelectric transformer 1. In particular, the housing is designed to absorb ozone ($O_3$), which is produced during the plasma generation. The housing 12 is preferably embodied as an earthed and possibly catalytically active wire mesh.

Alternatively, the piezoelectric transformer 1 can be arranged only partially in a housing 12. In a further embodiment no housing 12 is provided surrounding the piezoelectric transformer.

Alternatively or in addition to the housing 12, the device can have an outer enclosure in which all other elements of the device are arranged.

In the exemplary embodiment shown in FIG. 2 the input voltage applied to the piezoelectric transformer 1 is strong enough to generate an alternating voltage in the output area 3 of the transformer 1, which ignites a plasma without a separate counter-electrode.

Figure 3:
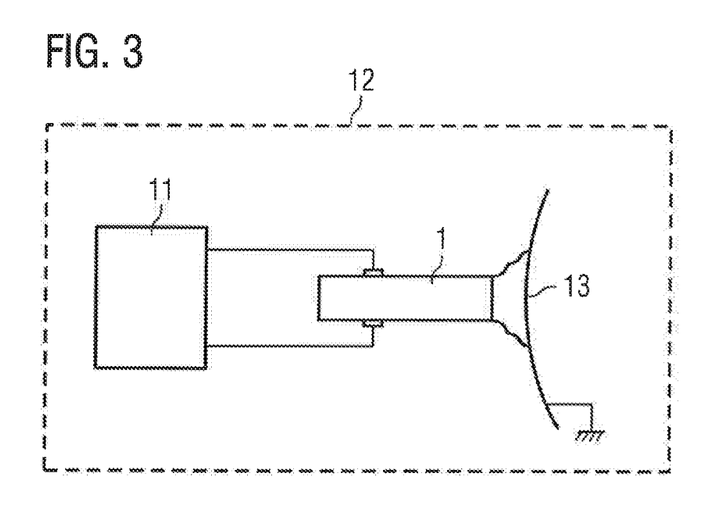
FIG. 3 shows the device according to a second exemplary embodiment in a schematic view.

FIG. 3 shows a device according to a second exemplary embodiment in which a counter-electrode 13 is provided. In the second exemplary embodiment also the control circuit 11 is designed to perform an amplitude modulation of the input voltage applied to the piezoelectric transformer 1, which leads to the generation of the acoustic signal.

The counter-electrode 13 is arranged in front of the output-side end face 10 of the piezoelectric transformer 1. The counter-electrode 13 is connected to a defined potential, in particular the ground potential. A voltage between the output-side end face 10 of the piezoelectric transformer 1 and the counter-electrode 13 ensures the plasma ignition. The counter-electrode 13 can be used either separately, as shown in FIG. 3, in the vicinity of the output area 3 of the piezoelectric transformer 1, or else correspond to the device of the housing 12. In addition, an additional outer housing can optionally be provided.

By igniting the plasma against a counter-electrode 13 an audible noise caused by the plasma can be very strongly or even totally suppressed, which provides a significant quality improvement, in particular for the use of the device as a tweeter in the audio field.

Figure 4:
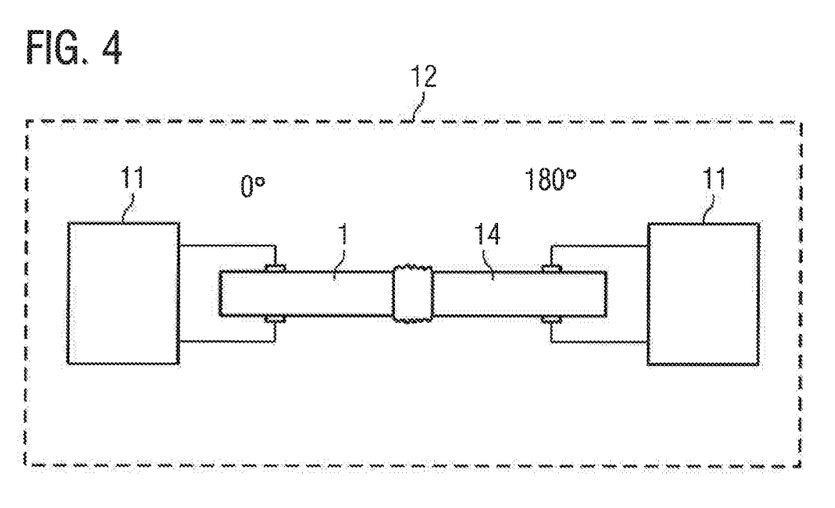
FIG. 4 shows the device according to a third exemplary embodiment in a schematic view.

FIG. 4 shows a third exemplary embodiment of the device for generating a non-thermal atmospheric pressure plasma and an acoustic signal. The device has two piezoelectric transformers 1, 14. The transformers 1, 14 are operated by the control circuit 11 out of phase by 180°. The plasma is ignited between the two transformers 1, 14. The control circuit 11 is in turn now designed to perform an amplitude modulation of the input voltages applied to the two piezoelectric transformers 1, 14.

The control circuit 11 can be implemented on two separate circuit boards, one board being connected to one of the transformers 1, 14 in each case, as shown in the schematic illustration of FIG. 4. Alternatively, the control circuit 11 can be implemented on a single circuit board, which is connected to both transformers 1, 14.

The ignition of the plasma between the two piezoelectric transformers 1, 14 operated with a phase offset also leads to a very strong or even complete suppression of a white acoustic noise, which is caused by the plasmas.

In addition, the device could have a plurality of adjacent piezoelectric transformers 1, each of which generating a plasma and an audible signal, for example, to increase the acoustic power. The piezoelectric transformers 1 could have different geometries and thus have different resonance frequencies from each other. In this case, the control circuit 11 is designed to drive the piezoelectric transformers with different carrier frequencies.

Figure 5:
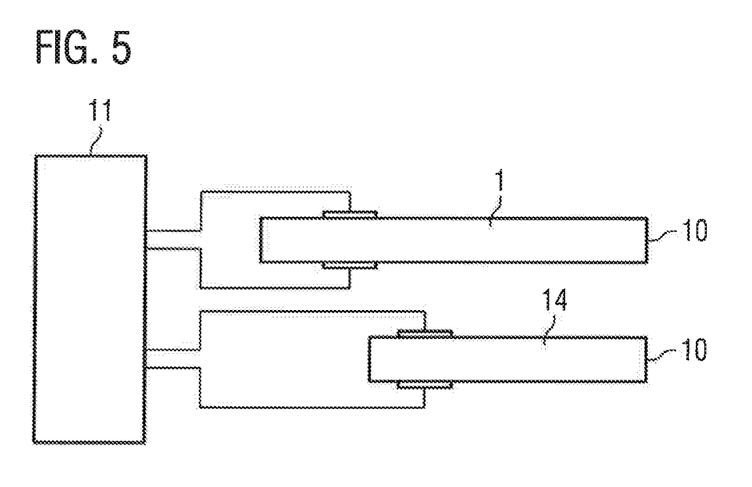
FIG. 5 shows the device according to a fourth exemplary embodiment, having two transformers arranged parallel to each other.

FIG. 5 shows the device according to a fourth exemplary embodiment. The device also has two piezoelectric transformers 1, 14. The two piezoelectric transformers 1, 14 are arranged parallel to each other. Accordingly, the output-side end faces 10 of the two piezoelectric transformers 1, 14 face in the same direction. The two piezoelectric transformers 1, 14 differ in length. Accordingly, the two piezoelectric transformers 1, 14 also differ in their respective resonance frequency.

The two piezoelectric transformers 1, 14 are connected to the control circuit 11. The control circuit 11 is designed to apply an alternating voltage to each of the two transformers 1, 14 as an input voltage, the frequency of the alternating voltage in each case corresponding to the resonance frequency of the respective transformer 1, 14. The control circuit 11 is also designed to modulate the amplitude of each input voltage, wherein each of the two transformers 1, 14 generates an acoustic signal as a result of the modulation.

The acoustic signal is thus generated by a plurality of piezoelectric transformers 1, 14, which differ in their resonance frequency and thus in the frequency of the input voltage applied by the control circuit 11 to the transformers 1, 14. The quality of each generated acoustic signal can thereby be improved compared to a signal generated by only a single transformer 1.

Figure 6:
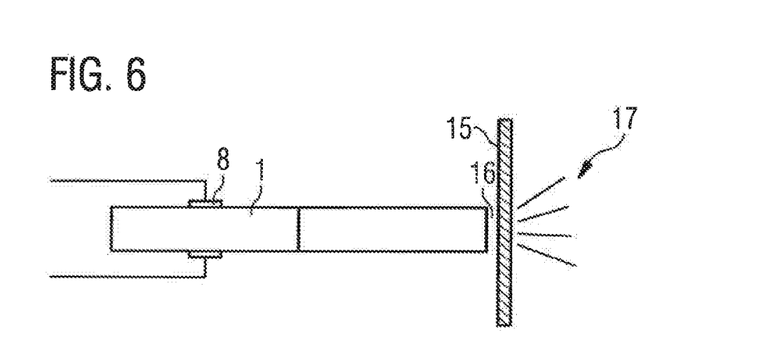
FIG. 6 shows the device according to a fifth exemplary embodiment in which the plasma ignition takes place behind a dielectric barrier, in a cross section.

FIG. 6 shows the device according to a fifth exemplary embodiment. The device has a piezoelectric transformer 1 and a dielectric barrier 15. The dielectric barrier 15 is arranged directly in front of the output-side end face 10 of the piezoelectric transformer 1. Between the piezoelectric transformer 1 and the dielectric barrier 15, a gap 16 is arranged.

The plasma ignition takes place in an ignition chamber 17, which is isolated from the piezoelectric transformer 1 by the dielectric barrier 15. The process medium is located in the ignition chamber 17. Accordingly, the piezoelectric transformer 1 does not come into direct contact with the process medium.

In particular in applications where a high pressure and/or high temperatures and/or aggressive or corrosive process media are used in the ignition chamber 17, the generation of the plasma in the ignition chamber 17, which is isolated from the piezoelectric transformer 1 by the dielectric barrier 15, is advantageous. In this case it is possible to avoid the piezoelectric transformer 1 from being damaged by the high pressure, the high temperature or the process medium. Also in applications in which the process medium consists of liquids or biological tissue, it is advantageous to generate the plasma in an ignition chamber 17 which is isolated from the piezoelectric transformer 1 by the dielectric barrier 15. Such an application may involve, for example, an endoscope having a piezoelectric transformer 1 for generating a non-thermal atmospheric pressure plasma.

A further advantage of the plasma ignition in an ignition chamber 17 which is isolated from the piezoelectric transformer 1 by the dielectric barrier 15 is that in this case the process medium does not attenuate the vibrations of the piezoelectric transformer 1. This is particularly important in the case of liquid or solid process media.

Also, to enable plasma ignitions against conductive materials without damaging the piezoelectric transformer 1 in the process, the plasma ignition can be advantageously carried out behind a dielectric barrier 15.

The dielectric barrier 15 can be a thin wall consisting of any dielectric, such as glass, $SiO_2$ or $Al_2O_3$. The dielectric barrier 15 is designed to capacitively couple a power generated at the output-side end face 10 of the piezoelectric transformer 1 into the ignition chamber 17, and thereby to trigger a plasma ignition in the ignition chamber 17.

In an alternative exemplary embodiment, the dielectric barrier 15 can be formed by a coating of the transformer 1. In this case, the coating can consist of a dielectric material, such as glass, $SiO_2$ or $Al_2O_3$.

The dielectric barrier 15 can be formed by an attachment which is arranged on the piezoelectric transformer 1. The attachment can be designed to supply a process medium to the output-side end face 10 of the piezoelectric transformer 1. The attachment can be a nozzle attachment.

Figure 7:
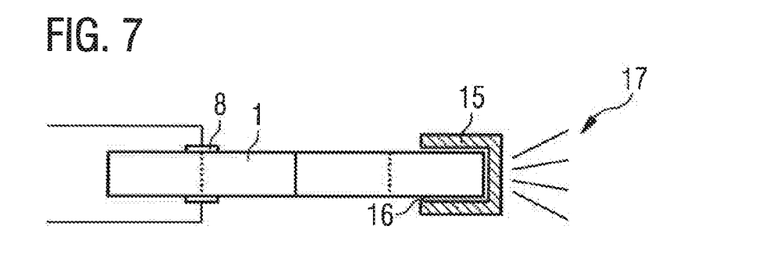
FIG. 7 shows the device according to a variation of the fifth exemplary embodiment in a cross section.
Figure 8:
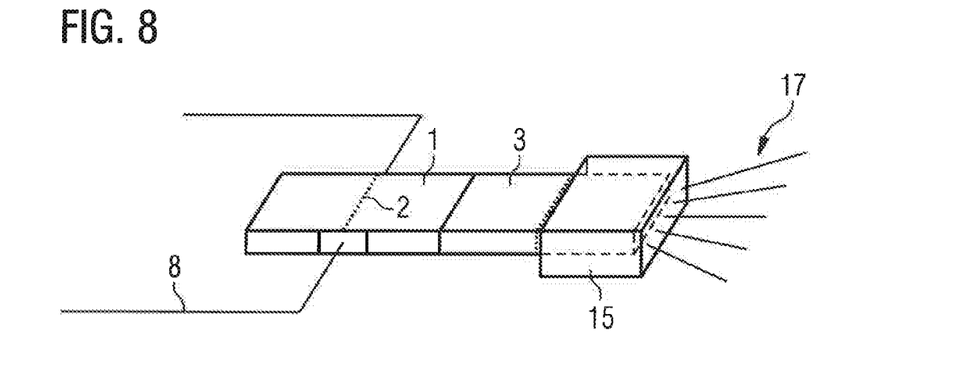
FIG. 8 shows the device shown in FIG. 7 in a perspective view.

FIG. 7 shows the device according to a variation of the fifth exemplary embodiment in a cross section. FIG. 8 shows this device in a perspective view.

The dielectric barrier 15 is not formed by a flat wall but forms a cavity that partially protrudes beyond the side walls of the piezoelectric transformer 1 in the output area 3. The piezoelectric transformer 1 can be inserted into the cavity formed by the dielectric barrier 15. The cavity can cover the piezoelectric transformer 1, for example, over a quarter of its length. In this case also, a gap 16 remains between the piezoelectric transformer 1 and the dielectric barrier 15. The plasma ignition takes place in an ignition chamber 17, which is isolated from the piezoelectric transformer 1 by the dielectric barrier 15.

Figure 9:
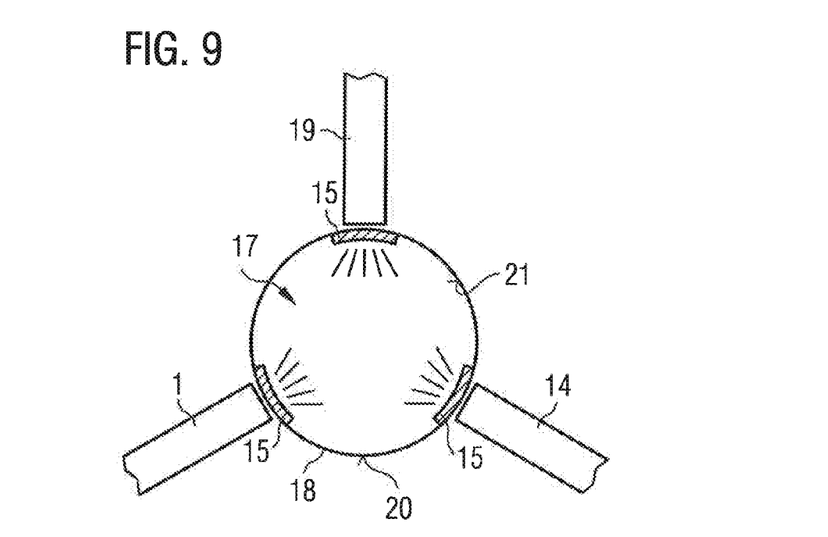
FIG. 9 and FIG. 10 show the device according to a sixth exemplary embodiment.
Figure 10:
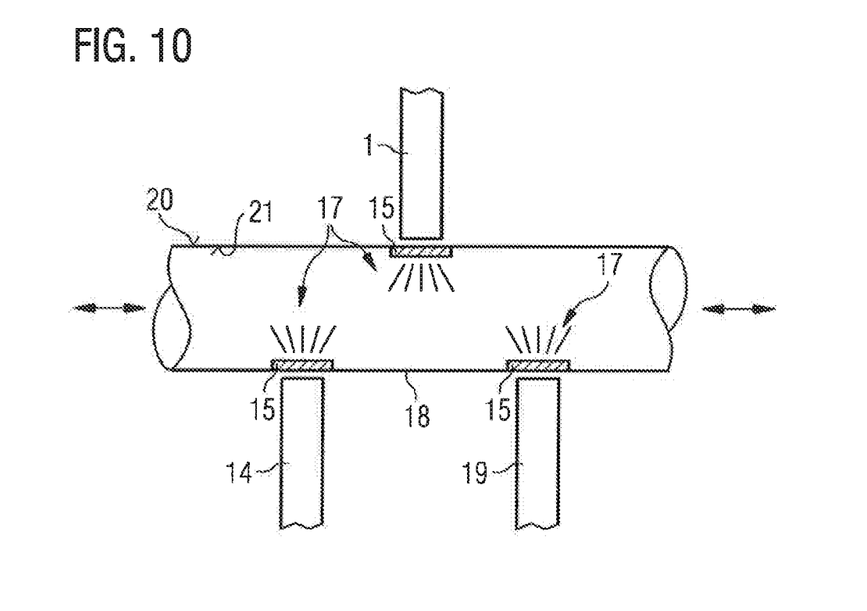

FIG. 9 and FIG. 10 show the device according to a sixth exemplary embodiment.

The ignition chamber 17 in this case is formed by a tube 18. The tube 18 has a wall, which is made, for instance, from steel. The process medium can flow through the tube 18 in any direction or be located statically in the tube 18.

The device has a plurality of, for example, three, piezoelectric transformers 1, 14, 19, which are each separated from the ignition chamber 17 by means of a flat dielectric barrier 15. The transformers 1, 14, 19 are arranged along the tube 18. As the process medium flows along the tube 18, it passes through the three piezoelectric transformers 1, 14, 19 in sequence. The transformers 1, 14, 19 are arranged on an outer side 20 of the tube 18. The dielectric barriers 15 are each arranged on an inner side 21 of the tube 18. In this case, the dielectric barriers 15 are arranged directly in front of a piezoelectric transformer 1, 14, 19 and only separated therefrom by the wall.

Each of the transformers 1, 14, 19 can generate a high voltage at its output-side end face 10, which is coupled via the dielectric barrier 15 into the interior of the tube 18, i.e., into the ignition chamber, where it triggers a plasma ignition. The control circuit, which is connected to each of the piezoelectric transformers 1, 14, 19, is designed to drive each of the piezoelectric transformers 1, 14, 19 with a modulated input voltage, so that an acoustic signal is generated in the ignition chamber 17.

Figure 11:
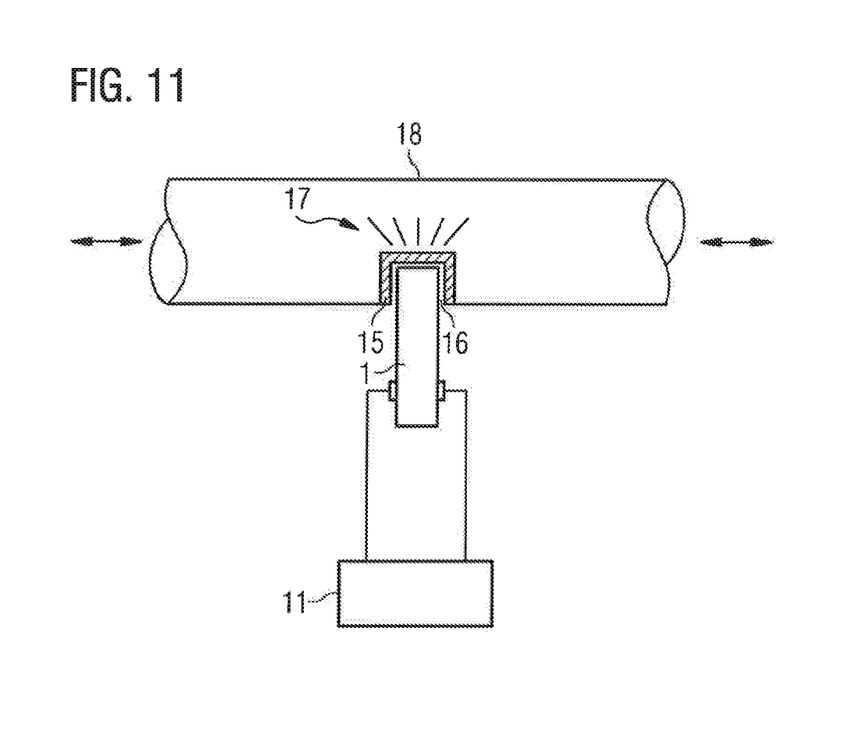
FIG. 11 shows a first variation of the sixth exemplary embodiment.

FIG. 11 shows a variation of the sixth exemplary embodiment. In the exemplary embodiment shown in FIG. 11 the dielectric barrier 15 is designed as a cavity, as also shown, for example, in FIGS. 7 and 8. The wall of the tube 18 forming the ignition chamber has a recess 22, into which the dielectric barrier 15 is fitted. The piezoelectric transformer 1 is in turn arranged in the cavity.

Figure 12:
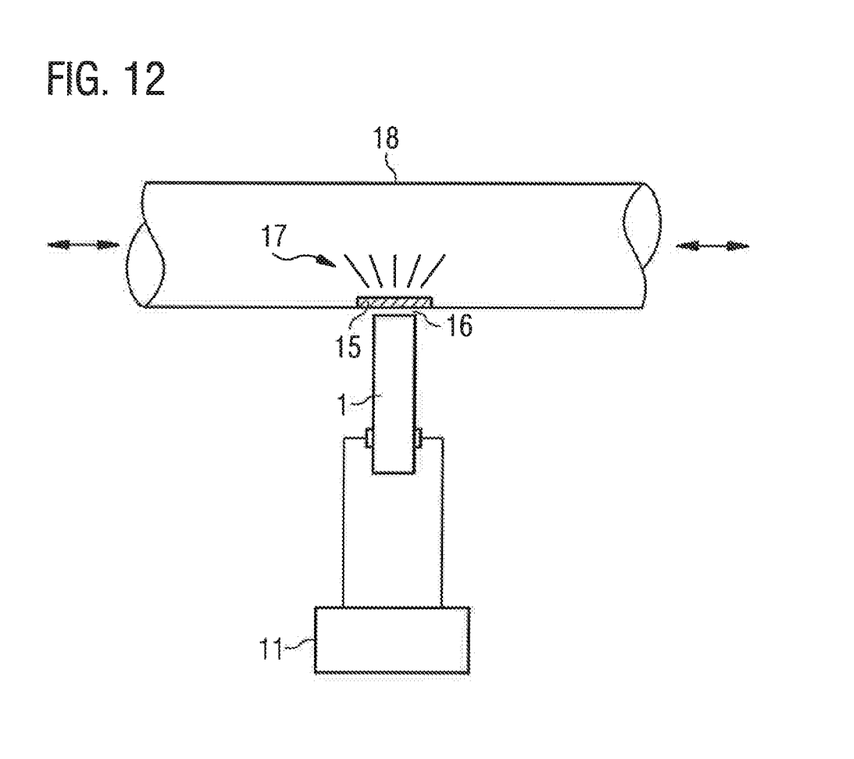
FIG. 12 shows a second variation of the sixth exemplary embodiment.

FIG. 12 shows a second variation of this exemplary embodiment. The variant shown in FIG. 12 is different from the exemplary embodiment shown in FIG. 10 due to the fact that in the tube 18 only one dielectric barrier 15 is arranged on the inner side 21 of the tube 18 and one piezoelectric transformer 1 on the outer side 22 of the tube 18. The number of the transformers 1 and dielectric barriers 15 can be arbitrarily large.

Figure 13:
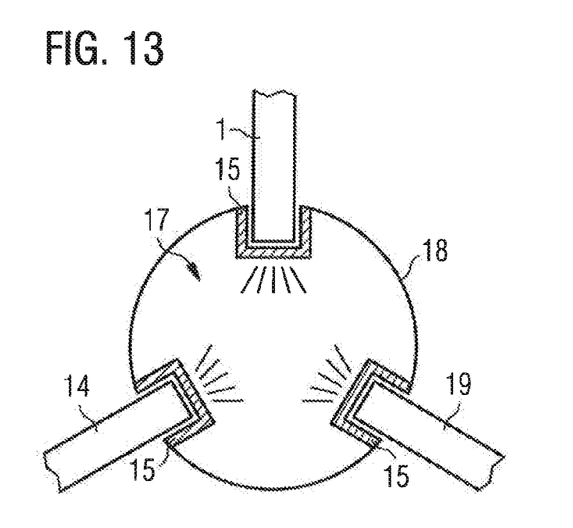
FIG. 13 and FIG. 14 show a third variation of the sixth exemplary embodiment.
Figure 14:
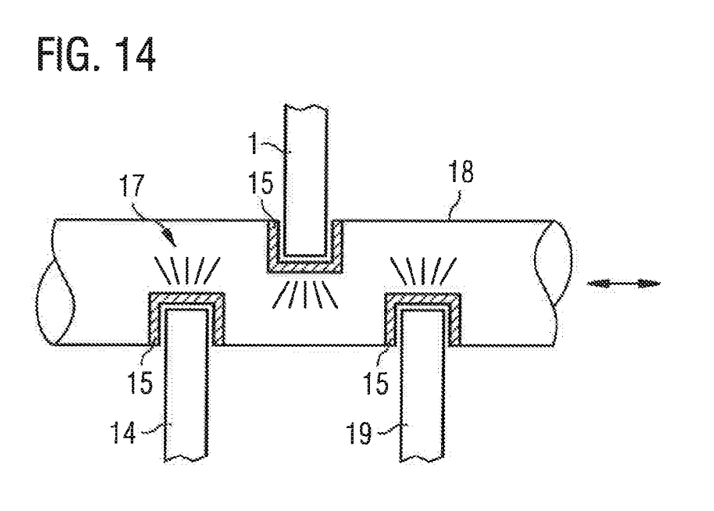

FIGS. 13 and 14 show a third variant of the sixth exemplary embodiment, in which a plurality of piezoelectric transformers 1, 14, 19 are provided. The wall of the tube 18 has a plurality of recesses 22, in each of which dielectric barriers 15 are arranged that form a cavity. In each of these cavities a piezoelectric transformer 1, 14, 19 is arranged, which can generate a plasma ignition inside the tube 18.

In each of the exemplary embodiments shown here, in which a plasma ignition takes place in an ignition chamber 17 isolated from the piezoelectric transformer 1 by the dielectric barrier 15, a control circuit 11 is connected to the piezoelectric transformer 1, designed to apply an input voltage to the transformer 1 and to perform a modulation of this input voltage. Due to the modulation, an acoustic signal is generated. The acoustic signal in these examples is accordingly always generated in the ignition chamber 17.

The invention claimed is:

1. A device comprising:
   a first piezoelectric transformer configured to ignite a non-thermal atmospheric pressure plasma in a process medium; and
   a control circuit configured to:
      apply an input voltage to the first piezoelectric transformer; and
      perform a modulation of the input voltage in such a way that the first piezoelectric transformer generates an acoustic signal as a result of the modulation.

2. The device according to claim 1, wherein the modulation is an amplitude modulation.

3. The device according to claim 1, wherein the control circuit is configured to:
   apply an alternating voltage with a carrier frequency to the first piezoelectric transformer as the input voltage; and
   modulate an amplitude of the applied input voltage with a modulation frequency, the modulation frequency being lower than the carrier frequency.

4. The device according to claim 1, wherein the acoustic signal has frequencies in an audible frequency range and/or in an ultrasonic frequency range.

5. The device according to claim 1, further comprising a housing in which the first piezoelectric transformer is arranged.

6. The device according to claim 5, wherein the housing is a resonant volume.

7. The device according to claim 6, wherein the housing has a catalytically active wire mesh.

8. The device according to claim 5, wherein the housing is trumpet-shaped.

9. The device according to claim 5, wherein the housing is configured to destroy ozone produced during a plasma ignition.

10. The device according to claim 1, wherein the first piezoelectric transformer is a Rosen transformer.

11. The device according to claim 1, wherein the first piezoelectric transformer comprise an output area configured to generate a high voltage that is sufficient to ignite the non-thermal atmospheric pressure plasma without a separate counter-electrode in the process medium.

12. The device according to claim 1, further comprising a counter-electrode, wherein the device is configured to ignite the non-thermal atmospheric pressure plasma by a voltage generated between an output area of the first piezoelectric transformer and the counter-electrode.

13. The device according to claim 1, wherein the device is configured to accelerate or catalyze chemical reactions.

14. The device according to claim 13, wherein the device is configured to destroy or break down pollutants.

15. The device according to claim 1, wherein the device is configured to activate or sterilize surfaces.

16. The device according to claim 1, wherein the process medium is a gaseous medium, a substance existing in a gaseous form at a working temperature and a working pressure, a mixture substance existing in gaseous form at a working temperature and a working pressure, an aerosol having liquid and/or solid particle suspended in a gas, a liquid, or biological tissue.

17. The device according to claim 1, wherein the process medium is an exhaust gas.

18. The device according to claim 1, wherein the process medium is an exhaust gas of an internal combustion engine.

19. The device according to claim 1, further comprising a dielectric barrier arranged in front of an output-side end face of the first piezoelectric transformer, wherein the device is configured to capacitively couple a high voltage generated at the output-side end face into an ignition chamber in which the process medium is located so that the non-thermal atmospheric pressure plasma is ignited in the process medium in the ignition chamber.

20. The device according to claim 1, further comprising a second piezoelectric transformer arranged opposite to the first piezoelectric transformer, wherein the control circuit is configured to apply an input voltage to the second piezoelectric transformer in such a way that the non-thermal atmospheric pressure plasma is generated by a voltage between the first and second piezoelectric transformers, and wherein the first and second piezoelectric transformers are configured to be driven 180° out of phase with each other.

21. The device according to claim 1, further comprising at least one further piezoelectric transformer arranged in parallel with the first piezoelectric transformer and having a different length than the first piezoelectric transformer, wherein the control circuit is configured to perform a modulation of an input voltage applied to the further piezoelectric transformer such that the further piezoelectric transformer is configured to generate an acoustic signal as a result of the modulation.

22. The device according to claim 1, wherein the device is a hand-held unit.

23. A loudspeaker comprising the device according to claim 1.

24. An exhaust system comprising the device according to claim 1.

25. A medical device comprising the device according to claim 1.

26. A unit comprising:
the device according to claim 1,
wherein the unit is configured to repel vermin.

27. An analysis unit comprising:
the device according to claim 1,
wherein the device is configured to ionize particles for analysis purposes and/or for cleaning an exhaust gas stream and/or breaking down relevant particles, and
wherein the analysis unit is configured to analyze particles.

28. A pipe system comprising:
the device according to claim 1.

29. The device according to claim 1, wherein an amplitude of the non-thermal atmospheric pressure plasma fluctuates according to the modulation of the input voltage.

30. The device according to claim 1, wherein a power of the non-thermal atmospheric pressure plasma varies with a modulation frequency of the modulation.

31. The device according to claim 1, wherein the acoustic signal is generated due to a fluctuation in a power of the non-thermal atmospheric pressure plasma, and wherein a frequency of acoustic signal matches a modulation frequency of the modulation.

32. The device according to claim 1, wherein the device is configured for use in a dental medicine.

33. The device according to claim 1, wherein the device is configured for cleaning and disinfecting teeth and/or gums by the non-thermal atmospheric pressure plasma and the acoustic signal in an ultrasonic frequency range.

34. The medical device according to claim 25, wherein the medical device is configured for dental caries treatment or treatment of wounds.

35. The medical device according to claim 25, wherein the medical device is a probe or an endoscope.

* * * * *